United States Patent
Kim

(10) Patent No.: US 7,940,134 B2
(45) Date of Patent: May 10, 2011

(54) ACTIVE YIG OSCILLATOR DRIVING DEVICE AND DRIVING METHOD THEREOF

(76) Inventor: Jin-Joong Kim, Daejeon (KR)

( * ) Notice: Subject to any disclaimer, the term of this patent is extended or adjusted under 35 U.S.C. 154(b) by 51 days.

(21) Appl. No.: 12/525,635

(22) PCT Filed: Feb. 1, 2008

(86) PCT No.: PCT/KR2008/000638
§ 371 (c)(1),
(2), (4) Date: Aug. 3, 2009

(87) PCT Pub. No.: WO2008/094019
PCT Pub. Date: Aug. 7, 2008

(65) Prior Publication Data
US 2010/0060368 A1  Mar. 11, 2010

(30) Foreign Application Priority Data

Feb. 2, 2007 (KR) .................. 10-2007-0010909
Jan. 25, 2008 (KR) .................. 10-2008-0008012

(51) Int. Cl.
*H03B 5/18* (2006.01)
(52) U.S. Cl. .................. 331/96; 331/107 R; 331/177 R; 342/128; 342/132; 342/175
(58) Field of Classification Search .................. 331/96, 331/107 R, 176, 177 R; 342/128, 132, 175
See application file for complete search history.

(56) References Cited

U.S. PATENT DOCUMENTS

| 5,376,938 | A | 12/1994 | Martinez et al. |
| 5,894,248 | A * | 4/1999 | Bedard ................ 331/177 R |
| 6,116,536 | A | 9/2000 | Williamson |
| 2005/0275479 | A1 | 12/2005 | Sutton |

FOREIGN PATENT DOCUMENTS

| JP | 62-132426 A | 6/1987 |
| JP | 2004-015745 A | 1/2004 |
| KR | 10-2006-0063581 | 6/2006 |

* cited by examiner

*Primary Examiner* — Arnold Kinkead
(74) *Attorney, Agent, or Firm* — Rabin & Berdo, PC

(57) ABSTRACT

An active YIG oscillator driving device is comprised of: an YIG oscillator including a main coil, an FM coil, a frequency generator operating to generate an output frequency in response to a magnetic field generated from the FM coil; a phase locker setting the output frequency to a target frequency by controlling an amount of current provided into the FM coil and adjusting the output frequency; and a main coil controller regulating the amount of current provided into the main coil, if the output frequency varies out of a controllable range by the FM coil, and adjusting the output frequency. A time for setting the output frequency of the YIG oscillator is shortened to improve the stability of the output frequency thereof against environmental conditions.

11 Claims, 3 Drawing Sheets

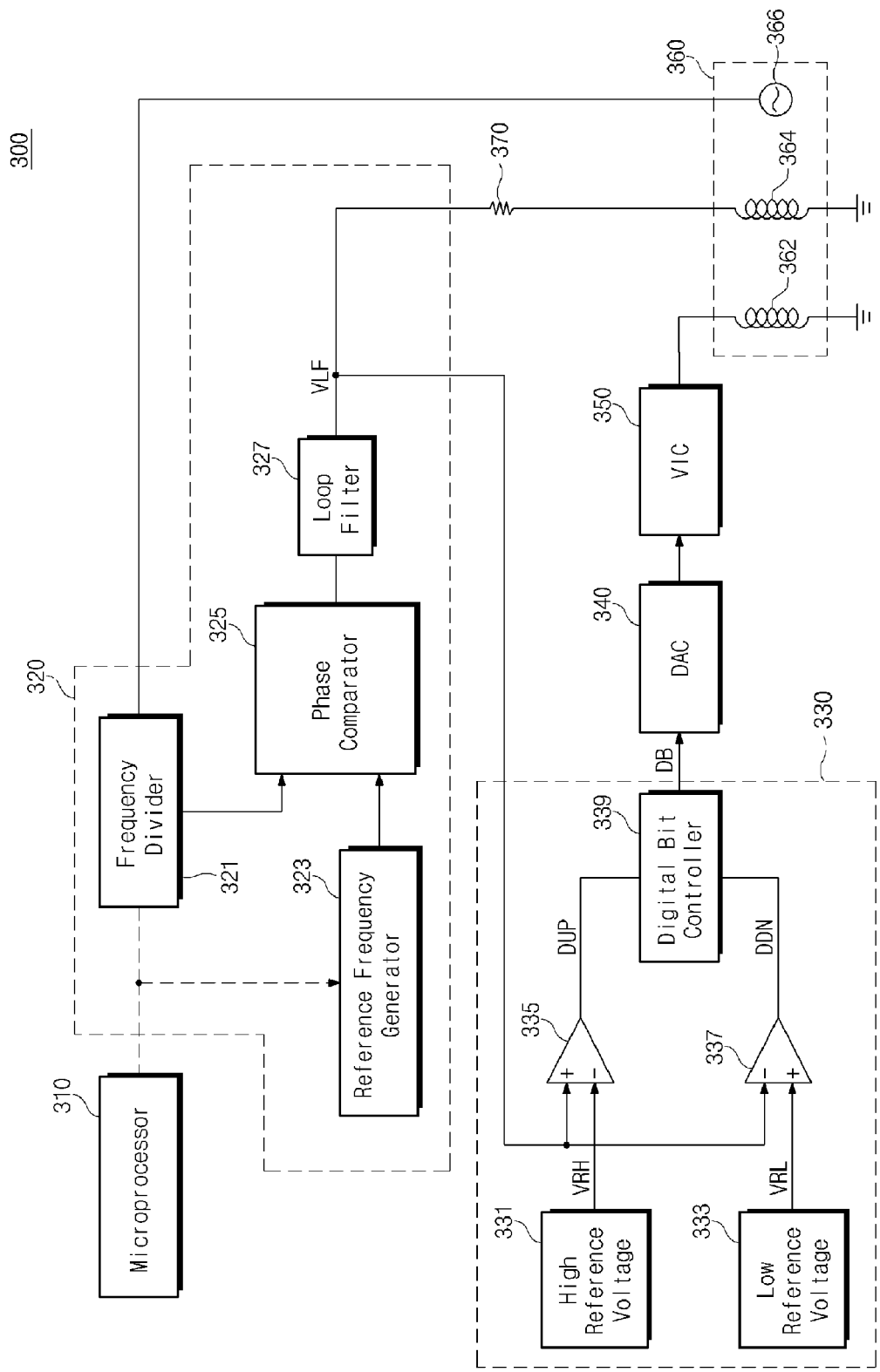
[Fig. 3]

ACTIVE YIG OSCILLATOR DRIVING DEVICE AND DRIVING METHOD THEREOF

TECHNICAL FIELD

The present invention relates to an Yttrium-Iron-Garnet (YIG) oscillator driving device. More particularly, the present invention disclosed herein is concerned with an YIG oscillator driving device controlling an YIG oscillator with an output voltage of a phase-locked loop (PLL) and improving a frequency set rate and stability of the YIG oscillator.

BACKGROUND ART

An output frequency of a frequency synthesizer employing an YIG is generally controlled by regulating a magnetic field applied to the YIG. A YIG oscillator is structured to include a main coil and a frequency-modulation (FM) coil. The main coil is configured in a structure that coils are wounded on an iron core, generating a high magnetic field. The FM coil is formed in an air-cored structure, generating a smaller magnetic field relative to the main coil. By controlling the magnetic fields generated from the main and FM coils, it is able to regulate an output frequency of the frequency synthesizer with the YIG oscillator.

FIG. 1 is a diagram of a general YIG oscillator driving device 100. Referring to FIG. 1, the general YIG oscillator driving device 100 is constructed by including a microprocessor 110, a frequency divider 120, a reference frequency generator 130, a phase detector 140, a loop filter 150, a digital-to-analogue converter (DAC) 160, a voltage-to-current converter (VIC) 170, a resistor 180, and an YIG oscillator 190.

The microprocessor 110 generates digital information correspondent to an output frequency to be output. The microprocessor 110 controls the frequency divider 120, the reference frequency generator 130, and the DAC 160 in response to the digital information.

The frequency divider 120 operates to divide an output frequency of the YIG oscillator 190 under the control of the microprocessor 110. The divided output frequency is transferred to the phase detector 140. The reference frequency generator 130 operates to generate a reference frequency under the control of the microprocessor 110. The reference frequency is supplied into the phase detector 140.

The phase detector 140 receives a frequency, which is divided from the output frequency of the YIG oscillator 190, from the frequency divider 120, and receives the reference frequency from the reference frequency generator 130. The phase detector 140 compares the divided frequency to the reference frequency and then outputs their frequency gap in the form of direct current (DC).

The loop filter 150 operates to smooth the DC output of the phase detector 140 and outputs the smoothed DC output. The loop filter 150 may be made up with a low pass filter (LPF). An output of the loop filter 150 is led to the YIG oscillator 190 by way of the resistor 180. The resistor 180 is provided to prevent an output voltage of the loop filter 150 from being lower.

The DAC 160 receives digital information from the microprocessor 110 and converts the digital information into an analogue signal. The VIC 170 converts an output (analogue signal) of the DAC 160 into a current signal. An output (current signal) of the VIC 170 is led to the YIG oscillator 190.

The YIG oscillator 190 is connected to the loop filter 150 through the resistor 180 and also connected to the VIC 170. The YIG oscillator 190 includes a main coil 192, an FM coil 194, and a frequency generator 196. The main coil 192 of the YIG oscillator 190 is supplied with current from the VIC 170 and generates a magnetic field corresponding thereto. The FM coil of the YIG oscillator 190 is supplied with current from the loop filter 150 through the resistor 180 and generates a magnetic field corresponding thereto. The frequency generator 196 of the YIG oscillator 190 generates an output frequency in response to the magnetic fields generated by the main and FM coils 192 and 194.

Responding to the digital information created by the microprocessor 110, the DAC 160 and the VIC 170 provides a constant current to the main coil 192 of the YIG oscillator 190. The main coil 192 generates the magnetic field in response to the constant current. The frequency divider 120, the reference frequency generator 130, the phase detector 140, the loop filter 150, the resistor 180, and the YIG oscillator 190 constitute a phase-locked loop (PLL). This PLL functions to control the current provided into the FM coil 194, regulating the output frequency of the YIG oscillator 190.

The output frequency of the YIG oscillator 190 is determined by responding to the magnetic fields generated from the main and FM coils 192 and 194. The magnetic field of the main coil 192 is larger than that of the FM coil 194. In other words, the output frequency of the YIG oscillator 190 is more affected from the main coil 192 than the FM coil 194 in magnetic field. Exemplarily, the output frequency of the YIG oscillator 190 may be affected from the main coil 192 in magnetic field of 90%, while from the FM coil 194 in magnetic field of 10%.

The output frequency of the YIG oscillator is variable in accordance with environmental conditions. In particular, if peripheral temperature changes, the output frequency of the YIG oscillator 190 may be sensitive to temperature. The main coil 192 of the YIG oscillator 190 is supplied with a large amount of the constant current (e.g., over hundreds mA). Namely, if temperature of the main coil 192 increases due to the current supplied into the main coil 192, the magnetic field is variable in magnetic field. The main coil 192 acts to charge 90% of the factors determining the output frequency of the YIG oscillator 190. In other words, if the magnetic field of the main coil 192 is changed, the output frequency of the YIG oscillator 190 is also variable.

The YIG oscillator driving device 100 as shown in FIG. 1 first regulates its output frequency on a target frequency by controlling the magnetic field of the main coil 192 with reference to the digital information that is predetermined in the microprocessor 110. Then, the output frequency is set to the target frequency by controlling the magnetic field of the FM coil 194 through the PLL. Eventually, if the output frequency of the YIG oscillator 190 is changed out of the permissible range by the FM coil 194 due to variation of environmental conditions, it is not always to lock the output frequency on the target frequency just by controlling the magnetic field of the FM coil 194.

FIG. 2 is a diagram showing another type of the YIG oscillator driving device for stabilizing an output frequency of the YIG oscillator. Reference numerals as like those used in the YIG oscillator driving device 100 of FIG. 1 denote the elements similar to those of the YIG oscillator driving device shown in FIG. 1. Referring to FIG. 2, an output voltage of a DAC 260 is added to an output voltage of the PLL through adders 272 and 274, and the sum of the output voltages are applied to a main coil 292. As the PLL controls the main coil 292 minutely, it extends a range of tracking the output frequency against environmental conditions and hence improves the stability of the YIG oscillator.

However, even with the YIG oscillator driving device 200 shown in FIG. 2, there is a limit to the range of tracking the output frequency of the YIG oscillator 290 against environmental conditions because the main coil 292 is supplied with a current also with reference to digital information that is predetermined by the microprocessor 210.

DISCLOSURE OF INVENTION

Technical Problem

Accordingly, the present invention is directed to an active YIG oscillator driving device improved in stability to peripheral temperature, shortening a time for setting an output frequency, by actively controlling a current supplied into a main coil of an YIG oscillator therein.

Technical Solution

An active YIG oscillator driving device according to the present invention is comprised of: an YIG oscillator including a main coil, an FM coil, a frequency generator operating to generate an output frequency in response to a magnetic field generated from the FM coil; a phase locker setting the output frequency to a target frequency by controlling an amount of current provided into the FM coil and adjusting the output frequency; and a main coil controller regulating the amount of current provided into the main coil, if the output frequency varies out of a controllable range by the FM coil, and adjusting the output frequency.

In an embodiment, the phase locker includes: a reference frequency generator; a frequency divider operating to divide the output frequency; a phase comparator operating to compare an output frequency of the reference frequency generator with an output frequency of the frequency divider; and a loop filter providing a smoothed output to the FM coil from the phase comparator.

In an embodiment, the main coil controller includes: a digital information generator detecting whether an output voltage of the phase locker is out of a predetermined range, and outputting a digital bit in accordance with a result of the detection; a DAC converting the digital bit into an analogue signal; and a VIC converting the analogue signal of the DAC into a form of current and providing the current into the main coil. The digital information generator further includes: a high-reference voltage generator operating to generate a high reference voltage with the same as an upper-limit level of the output voltage of the phase locker; a first voltage comparator operating to compare the output voltage of the phase detector with the high reference voltage and outputting a digital-up signal if the output voltage of the phase locker is higher than the high reference voltage; and a digital bit controller increasing the digital bit in response to the digital-up signal. The digital information generator includes: a low-reference voltage generator operating to generate a low reference voltage with the same as a lower-limit level of the output voltage of the phase locker; and a second voltage comparator operating to compare the output voltage of the phase detector with the low reference voltage and outputting a digital-down signal if the output voltage of the phase locker is lower than the low reference voltage. The digital bit controller decreases the digital bit in response to the digital-down signal.

Another aspect of the present invention is a method for driving an YIG oscillator that includes a main coil, an FM coil, a frequency generator operating to generate an output frequency in response to a magnetic field generated from the FM coil. This method is comprised of: controlling an amount of current provided into the FM coil and locking the output frequency on a target frequency; and controlling an amount of current provided into the main coil if the output frequency is unlocked on the target frequency.

In an embodiment, the locking the output frequency and the controlling the amount of current provided into the main coil are repeated until the output frequency reaches the target frequency.

In an embodiment, the controlling the amount of current provided into the main coil is carried out to reduce the amount of current provided into the main coil if the output frequency is higher than the target frequency over a controllable range by the FM coil.

In an embodiment, the controlling the amount of current provided into the main coil is carried out to increase the amount of current provided into the main coil if the output frequency is lower than the target frequency over a controllable range by the FM coil.

Advantageous Effects

According to the present invention, if an output frequency of an YIG oscillator varies out of a controllable range by an FM coil, an amount of current supplied into the main coil is controlled to regulate the output frequency. Thus, it is able to shorten a time for setting the output frequency and improve the stability of the output frequency to environmental conditions.

BRIEF DESCRIPTION OF THE DRAWINGS

FIG. 3 is a diagram showing an active YIG oscillator driving device in accordance with the present invention.

BEST MODE FOR CARRYING OUT THE INVENTION

Figure 1:
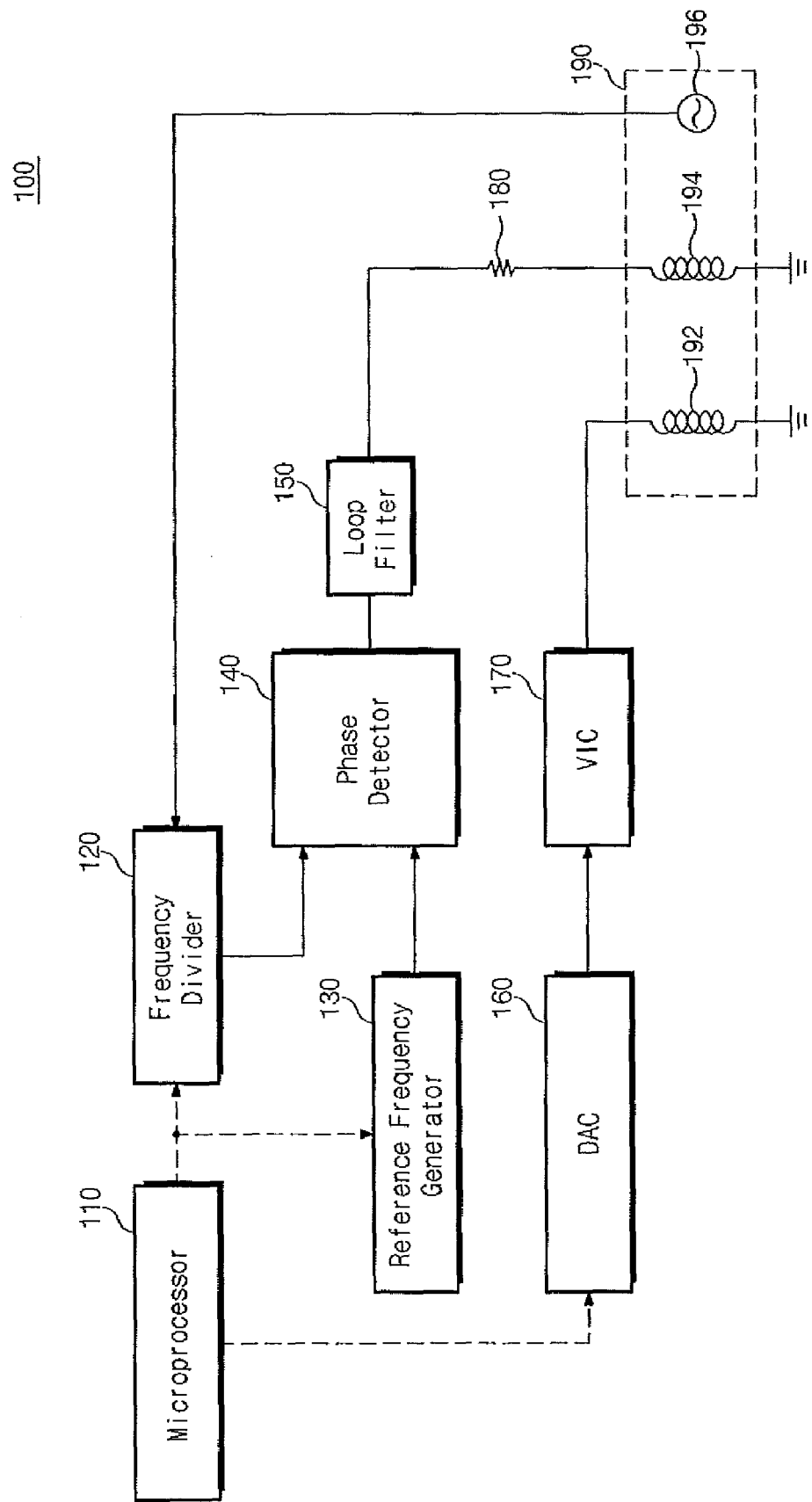
FIG. 1 is a diagram of a general YIG oscillator driving device 1100.
Figure 2:
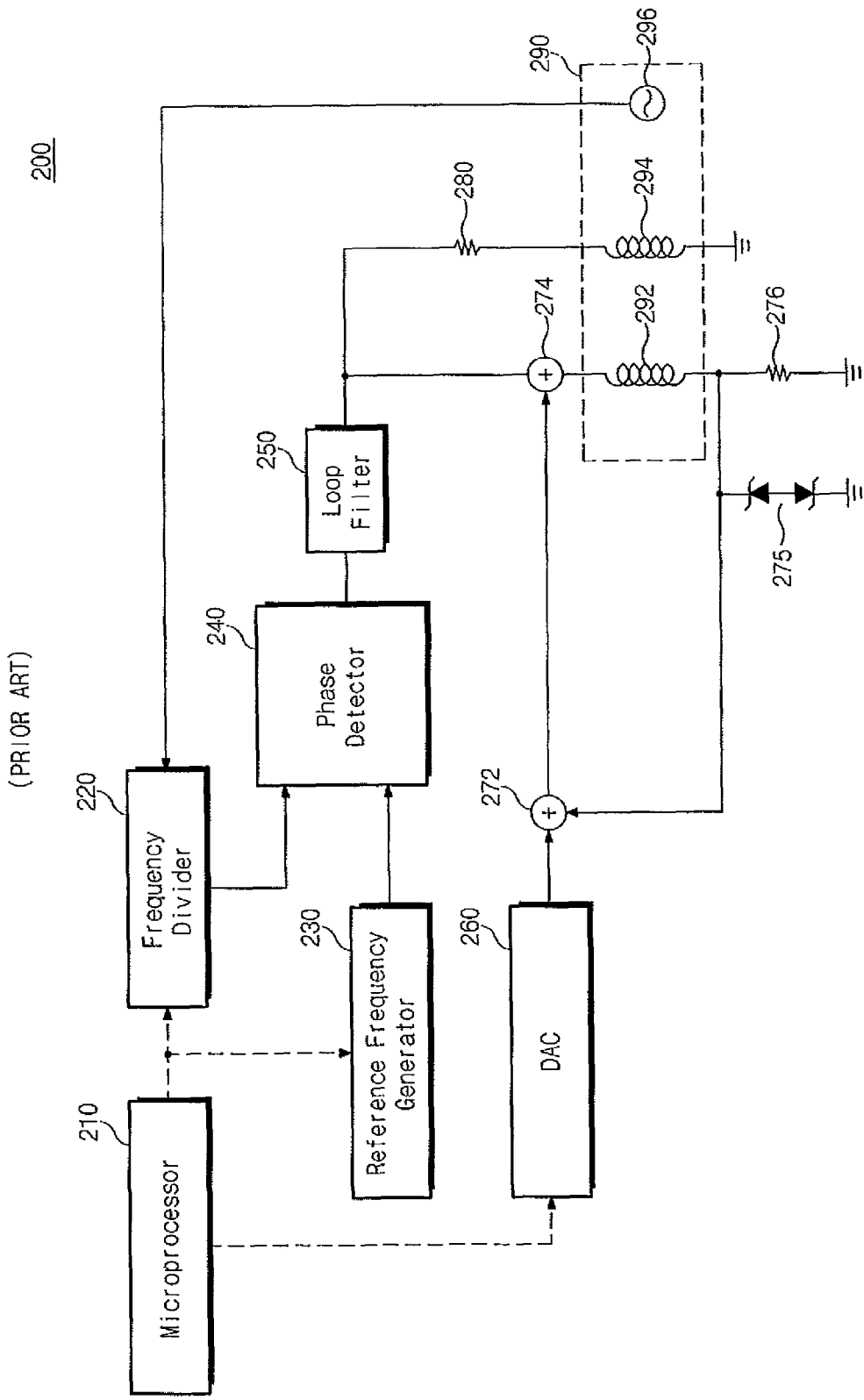
FIG. 2 is a diagram showing another type of the YIG oscillator driving device for stabilizing an output frequency of the YIG oscillator.

An active YIG oscillator driving device according to the present invention operates to regulate an output frequency thereof by controlling a current supplied into a main coil of an YIG oscillator when an output voltage level of PLL is out of a predetermined range. Therefore, it shortens a time for setting the output frequency of the YIG oscillator driving device, improving the stability thereof to environmental conditions.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

FIG. 3 is a diagram showing an active YIG oscillator driving device 300 in accordance with the present invention. Referring to FIG. 3, the active YIG oscillator driving device 300 according to the present invention 300 is comprised of a microprocessor 310, a phase locker 320, a digital information generator 340, a digital-to-analogue converter (DAC) 340, a voltage-to-current converter (VIC) 350, an YIG oscillator 360, and a resistor 370.

The microprocessor 310 controls a frequency divider 321 and a reference frequency generator 323 of the phase locker 320.

The phase locker 320 operates to lock an output frequency of the YIG oscillator 360 on a target frequency in response to the control of the microprocessor 310. The phase locker 320 is comprised of the frequency divider 321, the reference frequency generator 323, a phase comparator 325, and a loop filter 327.

The frequency divider 321 receives the output frequency from the YIG oscillator 360 and divides the output frequency. The divided frequency is transferred to the phase comparator 325. The reference frequency generator 323 operates to generate a reference frequency for establishing a target frequency. Exemplarily, an output frequency from the reference frequency generator 323 may be a frequency resulting from dividing a target frequency by the divisor of the frequency divider 321. The phase comparator 325 receives the output frequencies from the frequency divider 321 and the reference frequency generator 323, and outputs a difference between the two output frequencies. The loop filter 327 can provide an output of the phase comparator 325 in a form of voltage. Exemplarily, the loop filter 327 may be a low pass filter. An output voltage of the loop filter 327 is transferred to the digital information generator 330 and the YIG oscillator 360.

The digital information generator 330 receives the output voltage of the loop filter 327 from the phase locker 320. The digital information generator 330 is comprised of a high-reference voltage generator 331, a low-reference voltage generator 333, a first voltage comparator 335, a second voltage comparator 337, and a digital bit controller 339.

The high-reference voltage generator 331 outputs a high reference voltage VRH. The high reference voltage VRH may be laid on the same as the upper-limit voltage level that can be output by the loop filter 327 of the phase locker 320. The high reference voltage VRH is applied to the inverting input node of the first voltage comparator 335.

The low-reference voltage generator 333 outputs a low reference voltage VRL. The low reference voltage VRL may be laid on the same as the lower-limit voltage level that can be output by the loop filter 327 of the phase locker 320. The low reference voltage VRL is applied to the non-inverting input node of the second voltage comparator 337.

To the inverting input node of the first voltage comparator 335, the high reference voltage VRH is applied from the high-reference voltage generator 331. An output voltage VLF of the loop filter 327 is applied to the non-inverting input node of the first voltage comparator 335. An output of the first output comparator 335 is transferred to the digital bit controller 339 as a digital-up signal DUP.

The output voltage VLP of the loop filter 327 is applied to the inverting input node of the second voltage comparator 337. To the non-inverting input node of the second voltage comparator 337, the low reference voltage VRL is applied from the low-reference voltage generator 333. An output of the second voltage comparator 337 is transferred to the digital bit controller 339 as a digital-down signal DDN.

The digital bit controller 339 receives the digital-up and down signals, DUP and DDN, respectively from the first and second voltage comparators 335 and 337. If the digital-up signal DUP is logically high level, the digital bit controller 339 increases a digital bit DB. If the digital-down signal DDN is logically high level, the digital bit controller 339 decreases the digital bit DB. The digital bit DB is transferred to the DAC 340.

The DAC 340 receives the digital bit DB from the digital bit controller 339 of the digital information generator 330 and converts the digital bit DB into an analogue signal. An output from the DAC 340 is transferred to the VIC 350. The VIC 350 converts the output of the DAC 340 into a form of current. An output current from the VIC 350 is supplied to a main coil 362 of the YIG oscillator 360.

The YIG oscillator 360 is connected to the VIC 350 and the phase locker 320. The YIG oscillator 320 is comprised of the main coil 362, an FM coil 364, and a frequency generator 366. The main coil 362 is supplied with a current from the VIC 350 and generates a magnetic field. The FM coil 364 is supplied with a current from the loop filter 327 of the phase locker 320 through the resistor 370 and generates a magnetic field. The frequency generator 366 operates to generate a frequency in response to the magnetic fields of the main and FM coils 362 and 364.

The phase locker 320 and the YIG oscillator 360 constitute a phase-locked loop (PLL). This PLL is well known by those skilled in the art, so will not be further detailed.

The magnetic field generated by the main coil 362 of the YIG oscillator 360 is stronger than that generated by the FM coil 364. In other words, the output frequency of the frequency generator 366 is most determined by the magnetic field generated by the main coil 362. Exemplarily, the output frequency of the frequency generator 366 is affected from the main coil 362 in magnetic field by 90%, while from the FM coil 364 in magnetic field by 10%.

The output frequency of the YIG oscillator 360 is influenced from environmental conditions. Especially, if temperature of the YIG oscillator 360 elevates due to the current provided into the main coil 362 or the FM coil 364, the output frequency of the YIG oscillator 360 may be changed. If a variation rate of the output frequency of the YIG oscillator 360 is smaller than a frequency tracking range of the PLL formed of the phase locker 320, the FM coil 364, and the frequency generator 366, the output frequency of the YIG oscillator 360 may be fixed to the target frequency. But if the variation rate of the output frequency of the YIG oscillator 360 is larger than the frequency tracking range of the PLL, the output frequency of the YIG oscillator 360 cannot be fixed to the target frequency. Here, the output voltage VLF of the loop filter 327 may be defined in Equations 1 and 2 as follows.

$$VLF = \max, F(N) > F(R) \qquad \text{[Equation 1]}$$

where $F(N)$ is an output voltage of the frequency divider 321; and $F(R)$ is an output voltage of the reference frequency generator 323.

$$VLF = \min, F(N) < F(R) \qquad \text{[Equation 2]}$$

If the output frequency of the YIG oscillator 360 is fixed on the target frequency, the PLL operates in linearity. During this, the output voltage VLF of the loop filter 327 may be defined in Equation 3.

$$\min < VLF < \max, F(N) = F(R) \qquad \text{[Equation 3]}$$

In the case of reversing the input nodes of the phase comparator 325 and using the loop filter 327 in the inversive type, it will be seen by those skilled in the art that the signs of Equations 1 through 3 may be changed.

The output voltage VLF of the loop filter 327 is transferred to the second voltage comparator 337 of the digital information generator 330. The second voltage comparator 337 outputs the digital-down signal DDN from comparing the output voltage VLF of the loop filter 327 with the low reference voltage VRL. If the output voltage of the loop filter 327 reaches a voltage lower than the low reference voltage VRL, the digital-down signal DDN becomes logically high level. Referring to Equation 2, the digital-down signal DDN can be given by Equations 4 and 5.

$$DDN=\text{low}, F(N)=F(R) \qquad \text{[Equation 4]}$$

$$DDN=\text{high}, F(N)>F(R) \qquad \text{[Equation 5]}$$

The output voltage VLF of the loop filter 327 is transferred to the first voltage comparator 335 of the digital information generator 330. The first voltage comparator 335 outputs the digital-up signal DUP from comparing the output voltage VLF of the loop filter 327 with the high reference voltage VRH. If the output voltage of the loop filter 327 reaches a voltage higher than the high reference voltage VRH, the digital-up signal DUP becomes logically low level. Referring to Equation 1, the digital-up signal DUP can be given by Equations 6 and 7.

$$DUP=\text{low}, F(N)=F(R) \qquad \text{[Equation 6]}$$

$$DUP=\text{high}, F(N)<F(R) \qquad \text{[Equation 7]}$$

If the output frequency of the YIG oscillator 360 is fixed on the target frequency, the output frequencies from the frequency divider 321 and the reference frequency generator 323 are the same with each other. Unless the output frequency of the YIG oscillator 360 is fixed on the target frequency, the output frequencies from the frequency divider 321 and the reference frequency generator 323 are different from each other.

Referring to Equations 4 and 5, if the output frequency of the frequency divider 321 is higher than the output frequency of the reference frequency generator 323, i.e., if the output frequency of the YIG oscillator 360 is not fixed to the target frequency and the output frequency of the YIG oscillator 360 is higher than the target frequency, the digital-down signal DDN is set on logical high level. Thereby, the digital bit controller 339 decreases the digital bit DB to reduce the current flowing into the main coil 326 through the VIC 350. As a result, the intensity of the magnetic field generated from the main coil 362 becomes weaker to lower the output frequency of the YIG oscillator 360.

Referring to Equations 6 and 7, if the output frequency of the frequency divider 321 is lower than the output frequency of the reference frequency generator 323, i.e., if the output frequency of the YIG oscillator 360 is not fixed to the target frequency and the output frequency of the YIG oscillator 360 is lower than the target frequency, the digital-up signal DUP is set on logical high level. Thereby, the digital bit controller 339 increases the digital bit DB to increase the current flowing into the main coil 326 through the VIC 350. As a result, the intensity of the magnetic field generated from the main coil 362 becomes stronger to raise the output frequency of the YIG oscillator 360.

This procedure continues until the output frequency of the frequency divider 321 is controlled to be equal to that of the reference frequency generator 323, i.e., until the output frequency of the YIG oscillator 360 is fixed on the target frequency.

In summary, the active YIG oscillator driving device 300 according to the present invention operates to fix the output frequency of the YIG oscillator 360 on the target frequency by actively regulating the amounts of currents flowing into the main and FM coils 362 and 364 of the YIG oscillator 360. Even if environmental conditions cause the output frequency of the YIG oscillator 360 to vary out of the frequency tracking range by the FM coil 364, the active YIG oscillator driving device 300 of the present invention actively controls the current for the main coil 362 so as to set the output frequency of the YIG oscillator 360 on the target frequency. Therefore, it is able to shorten a time for setting the output frequency of the YIG oscillator 360 to the target frequency, improving the stability of the output frequency against environmental conditions.

In the aforementioned embodiment, the high and low reference voltages, VRH and VRL, are set on the same respectively with the upper and lower-limit levels of the output voltage VLF of the loop filter 327. Otherwise, for the purpose of operational performance of the active YIG oscillator driving device according to the present invention, it is permissible to make the high and low reference voltages VRH and VRL have margins by predetermined voltage levels from the upper and lower-limit levels of the output voltage VLF of the loop filter 327.

Additionally, the aforementioned embodiment of the present invention is described such that the digital bit controller 339 adjusts the digital bit DB when the digital-up or down signal, DUP or DDN, becomes logically high level. But, it is also able to render the digital bit controller 339 to adjust the digital bit DB even when the digital-up or down signal, DUP or DDN, is laid on logical low level.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

The present invention is applicable to frequency control technology for temperature stabilization.

The invention claimed is:

1. An active YIG oscillator driving device comprising:
an YIG oscillator including a main coil, an FM coil, a frequency generator operating to generate an output frequency in response to a magnetic field generated from the FM coil;
a phase locker setting the output frequency to a target frequency by controlling an amount of current provided into the FM coil and adjusting the output frequency; and
a main coil controller comprising:
a digital information generator detecting whether an output voltage of the phase locker is outside of a predetermined range, and outputting a digital signal in accordance with a result of the detection;
a DAC converting the digital signal into an analog signal; and
a VIC converting the analog signal into a main current and providing the main current into the main coil.

2. The active YIG oscillator driving device according to claim 1, wherein the phase locker comprises:
a reference frequency generator;
a frequency divider operating to divide the output frequency;
a phase comparator operating to compare an output frequency of the reference frequency generator with an output frequency of the frequency divider; and
a loop filter providing a smoothed output to the FM coil from the phase comparator.

3. The active YIG oscillator driving device according to claim 1, wherein the digital information generator comprises:
a high-reference voltage generator operating to generate a high reference voltage that is an upper-limit level of the output voltage of the phase locker;

a first voltage comparator operating to compare the output voltage of the phase detector with the high reference voltage and outputting a digital-up signal if the output voltage of the phase locker is higher than the high reference voltage; and a digital bit controller increasing the digital signal in response to the digital-up signal.

4. The active YIG oscillator driving device according to claim 3, wherein the digital information generator further comprises:

a low-reference voltage generator operating to generate a low reference voltage that is a lower-limit level of the output voltage of the phase locker; and a second voltage comparator operating to compare the output voltage of the phase detector with the low reference voltage and outputting a digital-down signal if the output voltage of the phase locker is lower than the low reference voltage, wherein the digital bit controller decreases the digital signal in response to the digital-down signal.

5. A method for driving an YIG oscillator that includes a main coil, an FM coil, a frequency generator operating to generate an output frequency in response to a magnetic field generated from the FM coil, the method comprising:

controlling an amount of current provided into the FM coil and locking the output frequency on a target frequency;

detecting whether an output voltage of a phase locker is outside of a predetermined range;

outputting a detection signal in accordance with a result of the detection; and converting the detection signal into a main current and providing the main current into the main coil.

6. The method according to claim 5, wherein the locking the output frequency, and the converting the detection signal into a main current and providing the main current into the main coil are repeated until the output frequency reaches the target frequency.

7. The method according to claim 5, wherein the converting the detection signal into a main current and providing the main current into the main coil is carried out so as to reduce the amount of the main current provided into the main coil if the output frequency is higher than the target frequency over a controllable frequency range of the FM coil.

8. The method according to claim 5, wherein the converting the detection signal into a main current and providing the main current into the main coil is carried out so as to increase the amount of the main current provided into the main coil if the output frequency is lower than the target frequency over a controllable frequency range of the FM coil.

9. The method according to claim 5, wherein the detection signal is a digital signal, and the step of converting the detection signal into a main current and providing the main current into the main coil includes converting the digital signal into an analog signal and converting the analog signal into the main current.

10. The method according to claim 9, further comprising regulating the amount of the main current provided into the main coil if the output frequency varies over a controllable frequency range of the FM coil, so as to adjust the output frequency.

11. The active YIG oscillator driving device according to claim 1, wherein the main coil controller regulates the amount of the main current provided into the main coil, if the output frequency varies over a controllable frequency range of the FM coil, so as to adjust the output frequency.

* * * * *